US005961737A

United States Patent [19]

Glenn

[11] Patent Number: 5,961,737

[45] Date of Patent: Oct. 5, 1999

[54] WELDED WIRE TERMINATION DEVICE AND METHOD FOR CONSTRUCTING A SOLAR ARRAY

[75] Inventor: Gregory S. Glenn, Pacific Palisades, Calif.

[73] Assignee: Hughes Electronics Corporation, El Segundo, Calif.

[21] Appl. No.: 08/764,801

[22] Filed: Dec. 12, 1996

[51] Int. Cl.$^{6}$ ............................ H01L 31/05; H01R 43/02

[52] U.S. Cl. ....................... 136/244; 136/252; 228/179.1; 228/180.5

[58] Field of Search .................................... 136/244, 256; 228/179.1, 210, 212, 180.5, 173.1, 173.6, 135, 139; 439/459, 462; 438/83

[56] References Cited

U.S. PATENT DOCUMENTS

| | | | |
|---|---|---|---|
| 3,340,096 | 9/1967 | Mann et al. | 136/244 |
| 3,620,847 | 11/1971 | Wise | 136/89 |
| 4,034,152 | 7/1977 | Warner | 174/94 |
| 4,724,011 | 2/1988 | Turner et al. | 136/249 |
| 4,854,974 | 8/1989 | Carlson et al. | 136/244 |
| 4,943,687 | 7/1990 | Armbruster et al. . | |
| 4,966,565 | 10/1990 | Dohi . | |
| 5,057,661 | 10/1991 | Banner | 219/56.22 |
| 5,365,088 | 11/1994 | Myrosznyk | 257/186 |
| 5,503,684 | 4/1996 | Duran | 136/251 |

FOREIGN PATENT DOCUMENTS

| | | |
|---|---|---|
| 0 490 723 A1 | 6/1992 | European Pat. Off. . |
| 3 629 864 A1 | 3/1987 | Germany . |

*Primary Examiner*—Nam Nguyen
*Assistant Examiner*—Michael C. Miggins
*Attorney, Agent, or Firm*—V. D. Duraiswamy; M. W. Sales

[57] ABSTRACT

A welded wire termination for use in thermally and mechanically stressful environments is provided by forming a wire termination tab on a conductive pad to define a tubule for receiving a wire, either stranded or solid. The tubule is tweezer welded to form a welded termination joint between the wire and the conductive tab. The tubule easily captures all of the stranded wires and increases the surface area of the weld to a solid lead. A tweezer weld exerts pressure laterally on the tubule, and thus does not exert a force on the underlying substrate that could damage the substrate. This approach creates only a single electro-mechanical connection from the wire to the conductive pad, which is inherently more reliable than multiple connections such as those that are crimped first then welded.

7 Claims, 4 Drawing Sheets

WELDED WIRE TERMINATION DEVICE AND METHOD FOR CONSTRUCTING A SOLAR ARRAY

BACKGROUND OF THE INVENTION

1. Field of the Invention

This invention relates to welded wire termination and more specifically to a wire termination tab that is integrally formed with a conductive surface, and which is formable into a tubule for receiving a wire for welded termination.

2. Description of the Related Art

In many applications such as satellite solar arrays and printed circuit (PC) boards wires must be terminated to a conductive pad to interconnect circuitry and other electrical systems. Typically, the wire is soldered flat to the conductive pad. However, in high reliability thermally stressful environments solder is not a viable option. Because of the mismatch between the thermal coefficients of expansion (TCE) for the solder, the wire, the conductive pad and its underlying substrate, extended thermal cycling will fatigue the solder and may cause it to crack and eventually fail. A satellite, for example, will thermal cycle between −180° C. and +80° C. for approximately 1600 cycles in a geosynchronous orbit and will thermal cycle between −80° C. and +100° C. for approximately 30,000 cycles in a low earth orbit. Furthermore, direct exposure to an extremely high temperature may liquify the solder causing the joint to fail. The potential for extremely high temperatures exists in military satellites, space probes which utilize solar array aerobraking and some automotive applications. To satisfy the reliability requirements in these types of thermally stressful environments, a non-solder wire termination is required.

The wires, either stranded wire or solid wire, can be terminated to a conductive pad by direct welding. Welding stranded wire to the conductive pad is difficult because the strands separate and may remain loose, thus risking a short circuit. Ensuring each strand is welded is an expensive labor intensive process. Solid wires such as diode or other component leads are difficult to weld because they are typically round and relatively thick, approximately 0.1 cm. Because they are round, the leads present only a small surface contact area with the conductive pad, which weakens the weld joint. Furthermore, the leads cannot be pressed sufficiently to reduce their thickness without sacrificing material integrity. As a result, a high power weld that exerts an extremely high localized pressure, for example 10,000 lbs per square inch (psi), on the underlying substrate is required. The weld may damage the underlying solar panel substrate which is typically formed from a thin brittle material such as graphite or Kevlar®.

A known approach is to crimp a flat lug onto the end of the wire and then weld the flat lug onto the surface of the conductive pad. There are several disadvantages to this process. First, a crimp lug that is strong enough to mechanically hold the wire strands must be relatively thick, e.g. 0.015 to 0.025 cm. The crimp lug is welded to the conductive pad using a pincher weld, in which opposing weld tips are placed on the surface of the lug and underneath the conductive pad, respectively. Because the lug is so thick, a force of approximately 10,000 psi has to be exerted on the weld tips to successfully weld the crimp lug to the conductive pad. Once the conductive pad is mounted onto its substrate, any repairs must be done using a parallel gap weld from the top surface. The extreme force required during welding can damage the thin, brittle graphite or Kevlar® substrates below the conductive pad. Furthermore, crimping the wire strands is an expensive labor intensive process, in which it is difficult to capture every strand. Stray strands can potentially cause a short. Because this approach involves two connections, pad-to-lug and lug-to-wire, the overall reliability of the wire termination is reduced. In addition, the crimped lug increases the series resistance of the connection.

SUMMARY OF THE INVENTION

In view of the above problems, the present invention provides a welded wire termination device and method that reduces the cost and improves the reliability of the welded wire termination in thermally or mechanically stressful environments.

This is accomplished by forming a wire termination tab on a thin conductive pad to define a tubule for receiving a wire, either stranded or solid. The tubule is tweezer welded to form a welded termination joint between the wire and the conductive tab. The tubule easily captures all of the stranded wires and increases the surface area of the weld since it is welded on both sides. A tweezer weld exerts pressure laterally on the tubule, and thus does not exert a force on the underlying substrate that could damage the substrate. This approach creates only a single electro-mechanical connection from the wire to the conductive pad, which is inherently more reliable than multiple connections.

These and other features and advantages of the invention will be apparent to those skilled in the art from the following detailed description of preferred embodiments, taken together with the accompanying drawings, in which:

DETAILED DESCRIPTION OF THE INVENTION

The present invention provides a high quality welded wire termination that exhibits a high reliability in a thermally stressful environment and can withstand exposure to extreme temperatures. A wire termination tab is formed on a conductive pad to define a tubule for receiving a wire, either stranded or solid. The tubule is tweezer welded to form a welded termination joint between the wire and the conductive tab. The tweezer weld does not exert a force on the underlying substrate that could damage the substrate. The tubule easily captures all of the stranded wires and increases the surface area of the weld to a solid lead.

Figure 1:
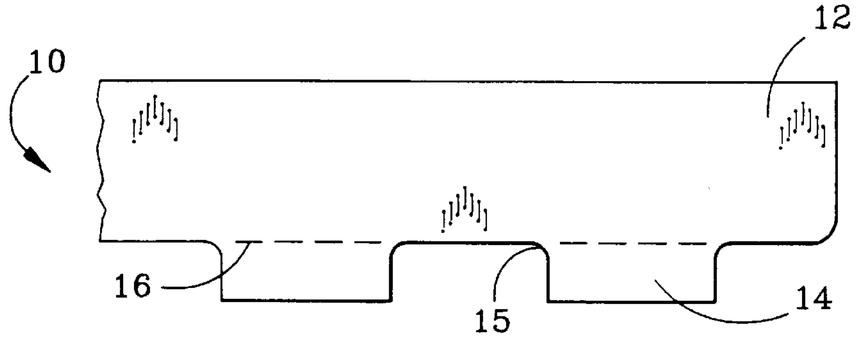
FIG. 1 is a plan view of a welded wire termination blank in accordance with the present invention.

FIG. 1 shows a termination blank 10 that includes a conductive pad 12 and a pair of wire termination tabs 14 that are integrally formed with the conductive pad 12 along an interior edge 16 and extend laterally therefrom. The wire termination tabs 14 preferably have opposing sides that extend laterally from the edge 16 and form a pair of rounded corners 15 with the edge, the corners 15 having a radius of curvature that reduces stress on the wire termination tab 14 when the tab is formed into a tubule. As detailed in FIGS. 2*a* through 2*d*, the wire termination tabs 14 are formed into tubules above the surface of the conductive pad 12 for receiving and terminating wires to the conductive pad. A layout designer specifies the number, size and position of the tubules on the conductive pad 12 as well as the size and shape of the pad itself. For example, an end termination tab for a solar cell may include three tabs that extend out of the conductive pad for connection underneath the solar cell and include two wire termination tabs for forming tubules to interconnect adjacent end termination tabs. A flat sheet of metal such as silver plated copper, molybdenum, kovar or invar is punched or etched to pattern the termination blank 10 as specified.

Figure 2A:
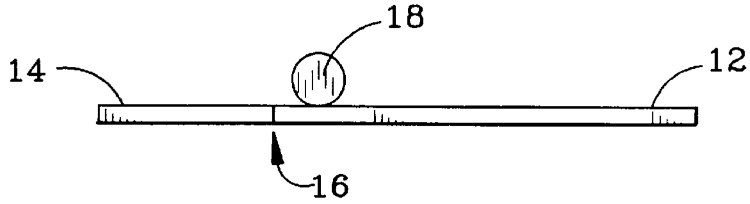
FIGS. 2*a* through 2*d* illustrate the process of forming the termination blank shown in FIG. 1 to provide a welded termination joint.

To form the tubules and terminate the wires, a die 18 is placed on the surface of the conductive pad 12 adjacent to the interior edge 16 of the wire termination tab 14 as shown in FIG. 2*a* The die preferably has an oval or circular shape so that the resulting tubule will have smoothed, and thus stronger, shape. The die has a diameter that is slightly larger than the diameter of the wire that will be inserted into the tubule.

Figure 2B:
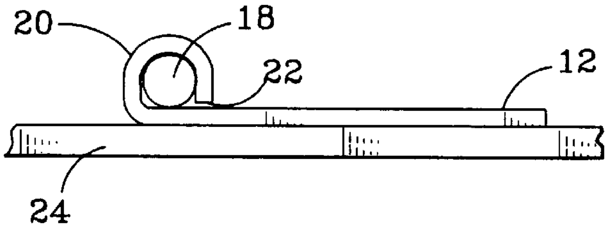

As shown in FIG. 2*b*, the wire termination tab 14 is formed around the die 18 to define a tubule 20 between the wire termination tab 14 and the conductive pad 12. In the preferred embodiment, the exterior edge 22 of the wire termination tab 14 is positioned proximate to the surface of the conductive pad 12, either just touching or slightly spaced apart from its surface.

Figure 2C:
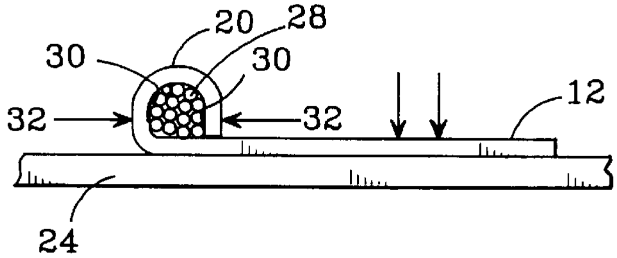

Once formed, the die 18 is removed and the conductive pad 12 is typically mounted onto a substrate 24 such as a solar panel as shown in FIG. 2*c*. A wire having strands 28 is inserted into the tubule 20 so that all of the strands 28 are captured by the tubule. Thereafter, the tubule 20 is tweezer welded to form a welded termination joint 30 that electromechanically connects the strands 28, and hence the wire, to the conductive pad. A tweezer weld entails placing a pair of electrodes 32 on opposites sides of the tubule 20 and forcing current through them while exerting an approximately lateral inward pressure of 15–20 lbs. The combination of heat and pressure produces the welded termination joint 30.

Figure 2D:
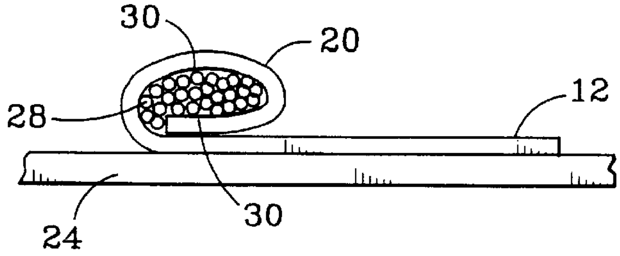

As shown in FIG. 2*d*, the pressure of the tweezer weld crushes the tubule inward which flattens the strands 28 and increases the surface area of the welded termination joint 30. To lower its profile, and thus reduce the chance that it could get ripped off of the conductive pad, the crushed tubule 20 is preferably bent down onto the surface of the conductive pad 12. A similar approach can be used for a solid wire.

Because the tweezer weld does not exert a downward force on the conductive pad 12, the underlying substrate 24 is not subjected to a localized force that could damage the substrate. Furthermore, tweezer welding the tubule produces a large and strong welded termination joint 30 that exhibits high reliability under extreme thermal conditions.

Figure 3A:
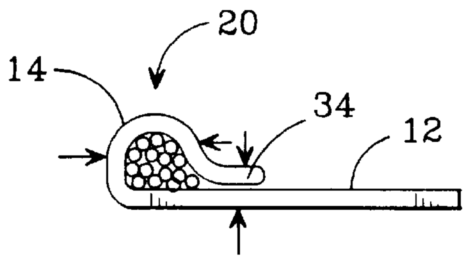
FIGS. 3*a* and 3*b* are sectional views of an alternate welded termination joint using pincher and parallel gap welding, respectively.
Figure 3B:
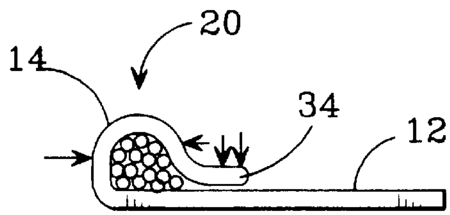

FIGS. 3*a*–3*b* and 4*a*–4*b* depict alternate embodiments of the welded termination joint. In FIGS. 3*a* and 3*b*, the wire termination tab 14 is formed so that it defines the tubule 20 and an exterior flange 34 on the surface of the conductive pad 12. The exterior flange 34 is welded to the conductive pad using a pincher weld (FIG. 3*a*) or a parallel gap weld (FIG. 3*b*). As long as the conductive pad 12 is not integrally formed with its substrate, the exterior flange 34 can be welded before the conductive pad 12 is attached to its substrate, thus avoiding any damage to the substrate. This approach provides a stronger and more well defined tubule 20 at the cost of an additional weld.

Figure 4A:
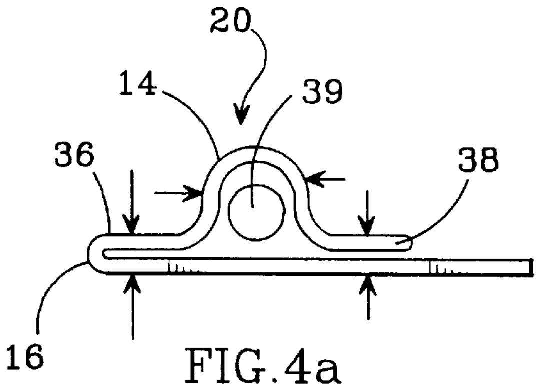
FIGS. 4*a* and 4*b* are sectional views of another alternate welded termination joint using pincher and parallel gap welding, respectively.
Figure 4B:
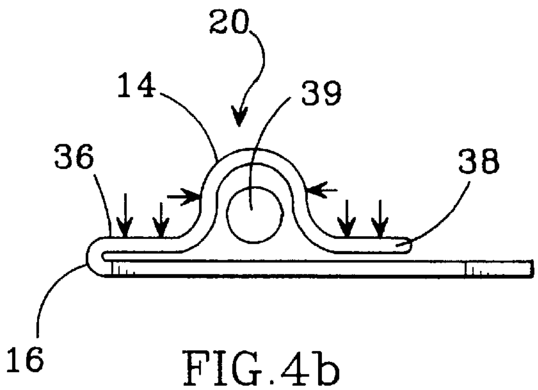

In FIGS. 4*a* and 4*b*, the wire termination tab 14 is formed so that it defines the tubule 20 and an interior flange 36 on one side of the tubule adjacent the interior edge 16 and an exterior flange 38 on the other side on the surface of the conductive pad 12. The interior and exterior flanges 36 and 38, respectively, are welded to the conductive pad using a pincher weld (FIG. 4*a*) or a parallel gap weld (FIG. 4*b*). A solid wire 39 is inserted into the tubule and tweezer welded. This approach provides an even stronger tubule that is offset from the edge of the conductive pad at the cost of two additional welds.

Figure 5:
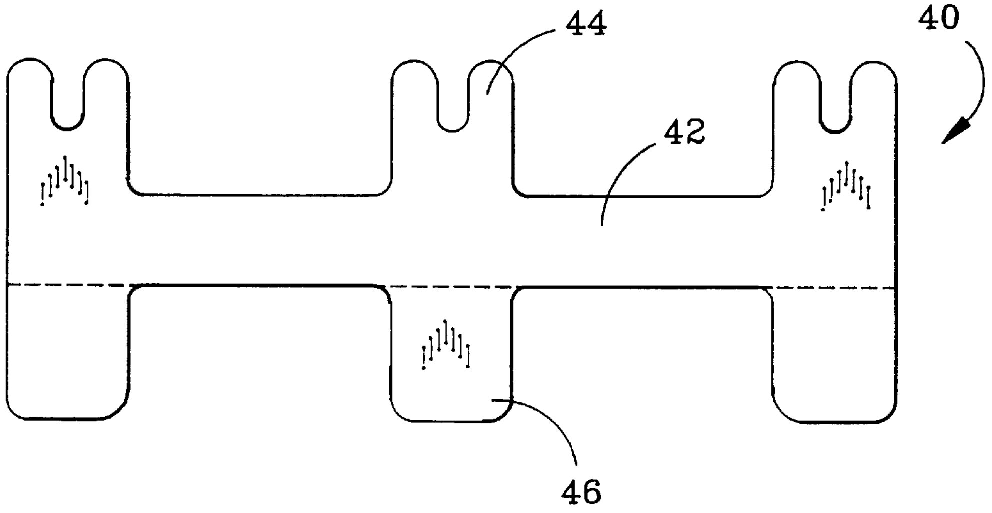
FIG. 5 is a plan view of an end termination tab for a solar array having integrally formed wire termination tabs.

A particular application for the welded wire termination of the present invention is in interconnection of series connected solar cell strings in a satellite solar array. As shown in FIG. 5, an end termination tab blank 40 is patterned with a conductive pad 42, three solar cell termination tabs 44 that extend laterally from one side of the pad for termination to a solar cell, and three wire termination tabs 46 that extend laterally from the other side of the pad for forming respective tubules to terminate welded wires.

Figure 6:
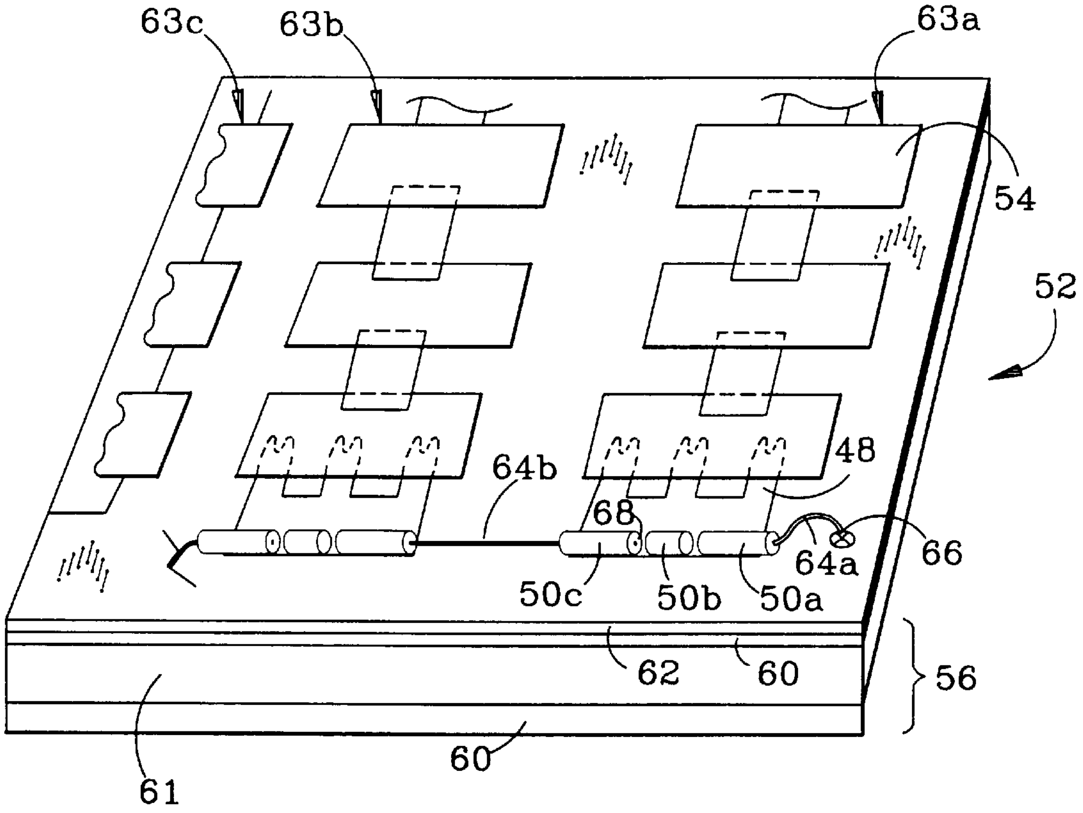
FIG. 6 is a perspective view of a solar array in which the wires are connected using the welded termination joint of the present invention.

The end termination tab blank 40 is formed into an end termination tab 48 having three tubules 50*a*, 50*b*, and 50*c* and used to clamp the soldered wires in a satellite solar array 52 as shown in FIG. 6. The solar array 52 includes a plurality of solar cells 54 that are connected in series to produce a desired voltage and in parallel to produce a desired current, and mounted on a solar panel substrate 56. The substrate 56 provides a rigid support structure with sufficient axial and bending stiffness for carrying the solar cells through a dynamic launch environment into orbit and positioning them to receive illumination. The substrate 56 is suitably formed by bonding a pair of thin facesheets 60, suitably Kevlar®, graphite or aluminum, onto opposite sides of an aluminum honeycomb core 61. If the material used in the facesheets 60 is conductive, an insulation layer 62 is formed over the top facesheet to electrically isolate the solar cells 54. The combination of the honeycomb core with the stiff facesheets provides a lightweight yet strong substrate 56. The TCEs of graphite and Kevlar® are much lower than the TCEs of the end termination tab and strap. In fact graphite composite structures can have a negative TCE such that it expands when cooled and contracts when heated, which produces stress on the solar array's soldered wires.

The solar cells 54 are connected in series to form strings 63*a*, 63*b*, . . . 63*n*. Each string is terminated with an end termination tab 48 having tubules 50*a*, 50*b*, and 50*c*. The strings are connected in parallel by terminating one end of a wire 64*a* to via a hole 66 in the substrate to a terminal board (not shown) , typically ground reference potential or the supply voltage. The other end of wire 64*a* is inserted into the opening defined by the tubule 50*a* on the end termination tab 48. The ends of wire 64*b* are inserted into the tubule 50*c* on the first end termination tab and the tubule 50*a* on the second end termination tab. The center tubule 50*b* is unused in this particular application but can be used for redundant wiring or wire rework. The sequence is repeated for each of the n end termination tabs 48 until the last wire is terminated to the reference terminal. The tubules 50*a* and 50*c* are tweezer welded to form welded termination joints 68 that connect one end of the strings 63*a*, 63*b*, . . . 63*n* in series/parallel. The other end of the strings 63*a*, 63*b*, . . . 63*n* are similarly terminated to the other reference terminal to complete the series/parallel connection of the solar cells 52.

Figure 7:
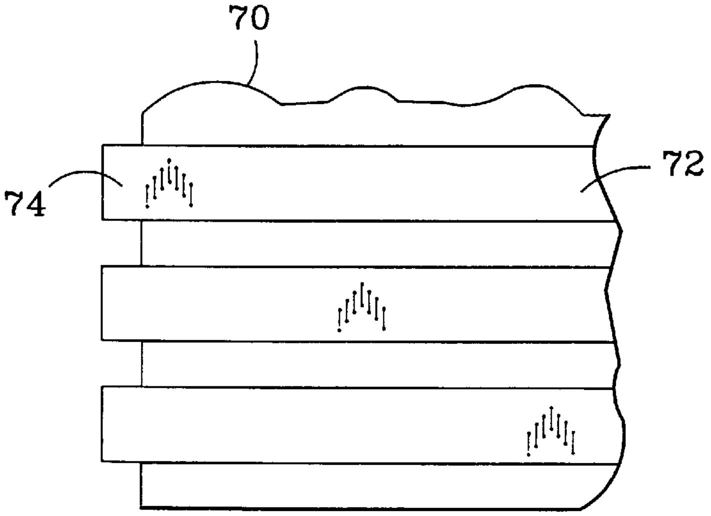
FIG. 7 is a plan view of a PC board having an integrally formed power bus with wire termination tabs.
Figure 8:
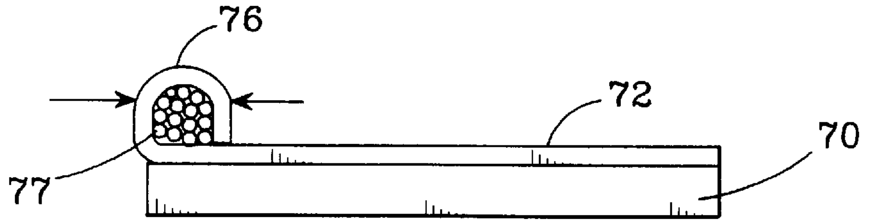
FIG. 8 is a sectional view of the PC board with the wire termination tabs formed into tubules for receiving a wire.

FIG. 7 is a plan view of a PC board 70 prior to the insertion of a stranded wire. A power bus 72 is integrally formed on the surface of the PC board 70 for distributing electrical signals to the circuitry on the board. A plurality of wire termination tabs 74 are integrally formed with the power bus 72 and extend laterally from the edge of the PC board 70. As shown in FIG. 8, the wire termination tabs 74 are formed on a die to define a tubule 76 over the surface of the power bus 72. i stranded wire 77 is inserted into the tubule 76 and tweezer welded to form a welded termination joint for communicating externals to the circuitry on the PC board 70.

Figure 9:
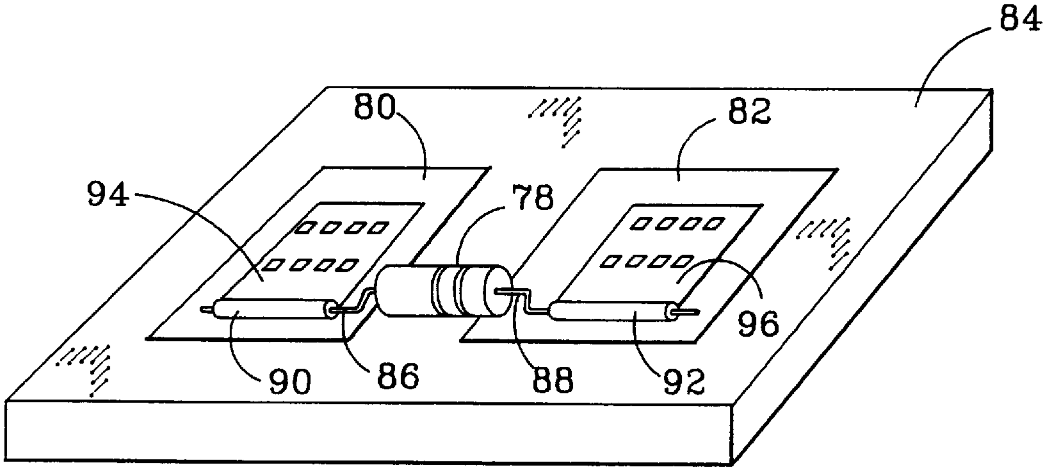
FIG. 9 is a perspective view of a pair of welded wire termination pad having tubules for terminating the solid diode leads.

The tubules can be used to rework terminated wires that have to be replaced. For example, if the weld joints between the leads of a diode and respective copper bus pads on a PC board become fatigued or fail, the terminated wires can be reworked by welding a pair of conductive pads formed with a tubule to the respective bus pads, inserting the leads into the tubules, and tweezer welding them to form a reliable weld termination joint. As shown in FIG. 9, a diode 78 is terminated between a pair of bus pads 80 and 82 on a PC circuit board 84 by welding its leads 86 and 88 to tubules 90 and 92, respectively. The tubules are integrally formed on a pair of conductive pads 94, 96, which are parallel gap welded to the bus pads 80 and 82. In an alternate embodiment, the conductive pads could be adhered directly to the PC board using a transfer adhesive.

While several illustrative embodiments of the invention have been shown and described, numerous variations and alternate embodiments will occur to those skilled in the art. For example, instead of patterning the wire termination tab integrally with the end termination tab or PC bus, a discrete wire termination tab could be formed into a yoke shape and either parallel gap or pincher welded to the end termination tab/PC bus to define the tubule. Such variations and alternate embodiments are contemplated, and can be made without departing from the spirit and scope of the invention as defined in the appended claims.

I claim:

1. An end termination tab for connecting solar cells, comprising:

a conductive pad having interior and exterior edges;

a cell termination tab that is integrally formed with and extends laterally from said conductive pad along its interior edge for connection to a solar cell; and a wire termination tab that is integrally formed with and extends laterally from said conductive pad along its exterior edge;

said wire termination tab being formable into a tubule for terminating a wire;

said wire termination tab having opposing sides that extend laterally from the exterior edge and forming a pair of rounded corners with the exterior edge, said corners having a radius of curvature that reduces stress on said wire termination tab when formed into a tubule.

2. A solar array, comprising:

a solar panel frame;

a facesheet on said solar panel frame;

a plurality of strings on said facesheet, each string comprising a plurality of series connected solar cells;

a plurality of end termination tabs that are connected to the respective strings;

a pair of tubules that are integrally formed with each of said end termination tabs;

a plurality of wires having first and second ends that extend through different tubules on adjacent end termination tabs to electrically connect the strings; and a plurality of welded termination joints, each comprising two laterally applied, opposing tweezer weld joints that connect the tubules to respective wires.

3. The solar array of claim 2, wherein said tubules are laterally compressed.

4. The solar array of claim 3, wherein said compressed tubules are folded into a flattened orientation with respect to their respective end termination tabs.

5. A method for constructing a solar array, comprising:

providing a solar panel;

providing a plurality of end termination tab blanks that are patterned to have a conductive pad, at least one solar cell termination tab, and a pair of wire termination tabs extending laterally therefrom;

forming the wire termination pads on a die to define a pair of tubules between the wire termination tabs and the conductive pad;

providing a plurality of series connected solar cell strings;

connecting the solar cell termination tabs to the respective strings;

inserting a plurality of wires having first and second ends into different tubules on adjacent end termination tabs to electricallly connect the strings; and tweezer welding the tubules to form welded wire terminations between the tubules and the wires.

6. The method of claim 5, wherein said wire termination tabs have an exterior edge, said wire termination tabs being formed on the die so that the tabs' exterior edges are positioned proximate to a surface of the conductive pads to define the tubules.

7. The method of claim 5, wherein the tubule is tweezer welded by:

placing a pair of electrodes on opposite sides of the tubule; and forcing current through the electrodes while applying inward lateral pressure on the tubule.

* * * * *